(12) United States Patent
Shibata et al.

(10) Patent No.: US 7,192,870 B2
(45) Date of Patent: Mar. 20, 2007

(54) SEMICONDUCTOR DEVICE AND FABRICATION PROCESS THEREFOR

(75) Inventors: Kazutaka Shibata, Kyoto (JP); Junji Oka, Kyoto (JP); Yasumasa Kasuya, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/122,052

(22) Filed: May 5, 2005

(65) Prior Publication Data

US 2005/0242445 A1  Nov. 3, 2005

Related U.S. Application Data

(62) Division of application No. 10/435,041, filed on May 12, 2003, now Pat. No. 6,936,499, which is a division of application No. 09/982,851, filed on Oct. 22, 2001, now Pat. No. 6,586,832.

(30) Foreign Application Priority Data

Oct. 23, 2000 (JP) .............................. 2000-322814

(51) Int. Cl.
 *H01L 21/302* (2006.01)
 *H01L 21/461* (2006.01)

(52) U.S. Cl. ............... 438/692; 438/108; 438/112; 257/E23.135; 257/706; 257/710; 257/729

(58) Field of Classification Search ........ 257/E23.062, 257/706, 738, 778, 779, 707, 710, 729, 709, 257/787, E23.135; 438/692, 108, 112, 612, 438/613
See application file for complete search history.

(56) References Cited

U.S. PATENT DOCUMENTS

| 5,374,469 | A | * | 12/1994 | Hino et al. ............... 428/209 |
|---|---|---|---|---|
| 5,404,273 | A | * | 4/1995 | Akagawa .................... 361/707 |
| 5,477,082 | A | | 12/1995 | Buckley |
| 5,574,285 | A | * | 11/1996 | Marion et al. ......... 250/370.13 |
| 5,841,194 | A | * | 11/1998 | Tsukamoto ................. 257/729 |
| 5,873,389 | A | | 2/1999 | Cheng |
| 5,883,430 | A | * | 3/1999 | Johnson ..................... 257/706 |
| 5,909,056 | A | | 6/1999 | Mertol |
| 5,909,057 | A | | 6/1999 | McCormick et al. ....... 257/704 |
| 6,066,512 | A | | 5/2000 | Hashimoto |
| 6,114,763 | A | | 9/2000 | Smith ........................ 257/738 |
| 6,140,707 | A | | 10/2000 | Plepys |
| 6,166,434 | A | | 12/2000 | Desai |
| 6,188,127 | B1 | * | 2/2001 | Senba et al. ................ 257/686 |
| 6,214,640 | B1 | * | 4/2001 | Fosberry et al. ........... 438/106 |
| 6,326,696 | B1 | | 12/2001 | Horton |

(Continued)

FOREIGN PATENT DOCUMENTS

JP  11284097  10/1999

(Continued)

*Primary Examiner*—Kenneth Parker
*Assistant Examiner*—Chris C. Chu
(74) *Attorney, Agent, or Firm*—Rabin & Berdo, P.C.

(57) ABSTRACT

A semiconductor device which includes: a semiconductor chip bonded to a surface of a solid device; and a stiffener surrounding the periphery of the semiconductor chip. A surface of the stiffener opposite from the solid device is generally flush with a surface of the semiconductor chip opposite from the solid device.

10 Claims, 2 Drawing Sheets

U.S. PATENT DOCUMENTS

| | | | |
|---|---|---|---|
| 6,365,438 B1 * | 4/2002 | Ishida et al. | 438/118 |
| 6,400,037 B1 | 6/2002 | Omizo | |
| 6,459,152 B1 * | 10/2002 | Tomita et al. | 257/738 |
| 6,507,116 B1 * | 1/2003 | Caletka et al. | 257/778 |
| 6,528,394 B1 | 3/2003 | Lee | 438/478 |
| 6,731,010 B2 * | 5/2004 | Horiuchi et al. | 257/777 |
| 6,770,971 B2 * | 8/2004 | Kouno et al. | 257/734 |
| 6,774,467 B2 * | 8/2004 | Horiuchi et al. | 257/673 |
| 6,794,273 B2 * | 9/2004 | Saito et al. | 438/462 |
| 6,882,054 B2 * | 4/2005 | Jobetto | 257/759 |
| 7,071,028 B2 * | 7/2006 | Koike et al. | 438/107 |
| 2002/0060084 A1 * | 5/2002 | Hilton et al. | 174/52.1 |
| 2003/0034569 A1 * | 2/2003 | Caletka et al. | 257/796 |
| 2003/0100142 A1 * | 5/2003 | Shin et al. | 438/110 |

FOREIGN PATENT DOCUMENTS

| | | |
|---|---|---|
| JP | 11307592 | * 11/1999 |
| JP | 2001267474 | 9/2001 |
| WO | WO 99/57764 | 11/1999 |

* cited by examiner

SEMICONDUCTOR DEVICE AND FABRICATION PROCESS THEREFOR

CROSS-REFERENCE TO RELATED APPLICATION

This is a divisional application of Ser. No. 10/435,041 filed May 12, 2003 (now U.S. Pat. No. 6,936,499 issued Aug. 30, 2005), which was a divisional application of Ser. No. 09/982,851 filed Oct. 22, 2001, now U.S. Pat. No. 6,586,832 issued Jul. 1, 2003.

BACKGROUND OF THE INVENTION

1. Field of the Invention

The present invention relates to a semiconductor device constructed such that a semiconductor chip is bonded to a surface of a solid device such as a wiring board or a second semiconductor chip.

1. Description of Related Art

Semiconductor devices of a flip chip bonding structure are hitherto known which, for example, have a semiconductor chip bonded to a surface of a wiring board with its face down. In such a flip-chip semiconductor device, the semiconductor chip is bonded to the wiring board with an active surface thereof being opposed to the wiring board. The semiconductor chip is physically and electrically connected to the wiring board in a predetermined spaced relation by a plurality of bumps provided between the semiconductor chip and the wiring board. Solder balls are provided as terminals for external connection on a rear surface of the wiring board. Where the number of the terminals are relatively great, the wiring board has a greater size than the semiconductor chip as viewed in plan. Therefore, a metal stiffener is provided as surrounding the periphery of the semiconductor chip to keep the planarity of the wiring board.

The semiconductor device having the aforesaid construction is fabricated, for example, by first bonding the semiconductor chip onto the wiring board and then providing the stiffener (which is a separate member from the semiconductor chip) on the wiring board. Therefore, the semiconductor chip and the stiffener, if each having a small thickness, are liable to be cracked or chipped during handling thereof for mounting thereof on the wiring board. This poses limitations to thickness reduction of the semiconductor chip and the stiffener and, hence, to thickness reduction of the entire semiconductor device.

SUMMARY OF THE INVENTION

It is an object of the present invention to provide a semiconductor device constructed so that fabrication thereof can be achieved without cracking and chipping of a semiconductor chip or a stiffener.

It is another object of the present invention to provide a fabrication process for a thin semiconductor device, which is free from cracking and chipping of a semiconductor chip and a stiffener.

The semiconductor device according to the present invention comprises: a semiconductor chip bonded to a surface of a solid device; and a stiffener surrounding the periphery of the semiconductor chip with a surface thereof opposite from the solid device being generally flush with a surface of the semiconductor chip opposite from the solid device.

The solid device may be a wiring board or a second semiconductor chip which is different from the semiconductor chip.

In accordance with the present invention, the stiffener which may be formed of a synthetic resin is provided around the semiconductor chip, whereby the solid device can be strengthened and prevented from being warped due to thermal stress.

In some cases, a heatsink plate for dissipating heat from the semiconductor chip is provided on the surface of the semiconductor chip opposite from the solid device. Even in such a case, the heatsink plate can easily be provided in contact with the surface of the semiconductor chip opposite from the solid device and the surface of the stiffener opposite from the solid device which are generally flush with each other.

Since the surface of the semiconductor chip opposite from the solid device is generally flush with the surface of the stiffener opposite from the solid device, a production serial number and the like can be inscribed across the flush surfaces. Even if the semiconductor chip has a small size as viewed in plan, a sufficient space can be provided for the inscription.

Where a plurality of inventive semiconductor devices are mounted in a stacked relation on a mounting board, a heightwise integration density can be increased because the semiconductor devices each have a smaller thickness.

The surface of the semiconductor chip opposite from the solid device and the surface of the stiffener opposite from the solid device are preferably mirror-finished surfaces. When the semiconductor device is mounted on a mounting board under monitoring with a camera, for example, the camera can recognize the semiconductor device with an improved accuracy because diffused light reflection on the semiconductor chip and the stiffener is suppressed. Therefore, the semiconductor device can accurately be positioned at a desired mounting position on the mounting board. The mirror-finished surfaces each have an increased surface strength, so that the warp of the semiconductor device can more effectively be prevented which may otherwise occur due to thermal expansion.

The semiconductor chip may be bonded to the solid device with an active surface thereof being opposed to the solid device. In this case, the semiconductor device is fabricated through a fabrication process which, for example, includes the steps of: bonding a semiconductor chip to a surface of a solid device with an active surface of the semiconductor chip being opposed to the solid device; providing a synthetic resin material to surround the periphery of the semiconductor chip with the synthetic resin material; and simultaneously planarizing the semiconductor chip bonded to the surface of the solid device and the synthetic resin material provided around the semiconductor chip after the resin provision step, so that a surface of the semiconductor chip opposite from the active surface is generally flush with a surface of the synthetic resin material opposite from the solid device.

In this process, the semiconductor chip and the synthetic resin material (stiffener) which initially each have a relatively great thickness are first provided on the surface of the solid device, and then subjected to the planarization for thickness reduction. Therefore, there is no possibility that the semiconductor chip and the stiffener suffer from cracking and chipping, unlike a process in which a thin semiconductor chip and a thin stiffener are provided on the surface of the solid device.

Even if a polishing or grinding process with the use of a grinder or a CMP (chemical mechanical polishing) process is employed for the planarization, a stress exerted on the semiconductor chip can be alleviated by simultaneously polishing or grinding the semiconductor chip and the synthetic resin material. Therefore, the warp and chipping of the semiconductor chip can be prevented.

The semiconductor chip may be spaced from the stiffener. With this arrangement, a space provided between the semiconductor chip and the stiffener can accommodate a difference in thermal expansion between the semiconductor chip and the stiffener even if the semiconductor device is exposed to a high temperature. Therefore, the warp of the semiconductor device can more effectively be prevented which may otherwise occur due to the thermal expansion.

A low elasticity filler having a lower elasticity than the stiffener maybe filled in a space defined between the surface of the solid device and the surface of the semiconductor chip opposed to the solid device. With this arrangement, the active surface of the semiconductor chip can be protected by the low elasticity filler filled in the space between the surface of the solid device and the surface of the semiconductor chip opposed to the solid device. Where the semiconductor chip is supported by bumps provided between the solid device and the semiconductor chip with the active surface thereof being opposed to the surface of the solid device, stresses exerted on the bumps can be alleviated by the low elasticity filler.

The foregoing and other objects, features and effects of the present invention will become more apparent from the following description of the preferred embodiments with reference to the attached drawings.

DESCRIPTION OF THE PREFERRED EMBODIMENTS

Figure 1:
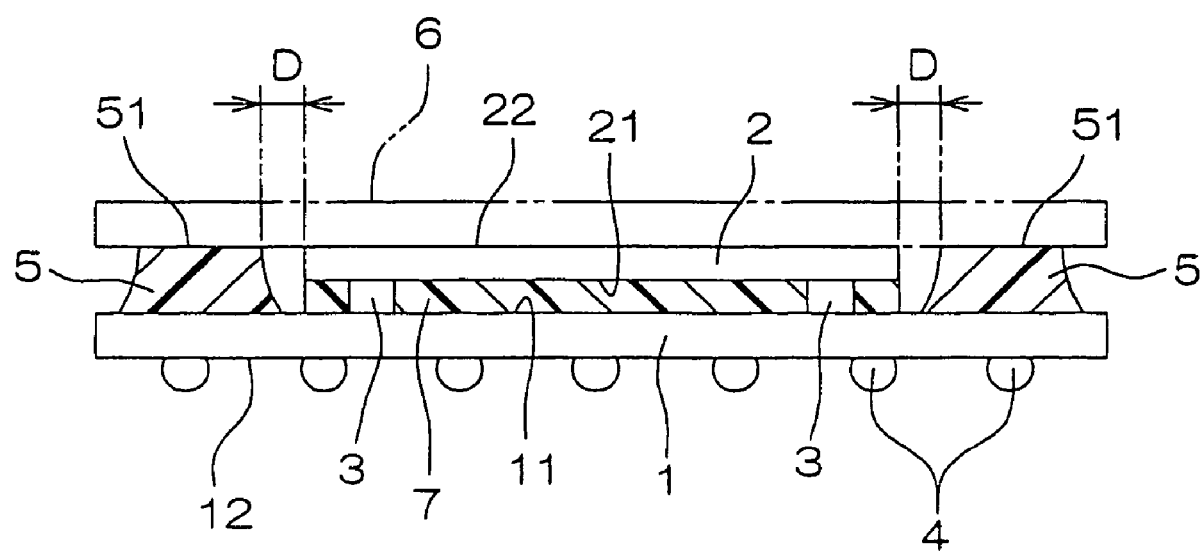
FIG. 1 is a sectional view schematically illustrating the construction of a semiconductor device according to one embodiment of the present invention.

FIG. 1 is a sectional view schematically illustrating the construction of a semiconductor device according to one embodiment of the present invention. The semiconductor device is of a so-called FCBGA (flip chip ball grid array) structure, and includes a thin wiring board 1 such as of a ceramic, a polyimide resin or a glass epoxy resin. The wiring board 1 has a wiring pattern (not shown) such as formed by copper plating.

A thin semiconductor chip 2, for example, having a thickness of not greater than 200 μm is bonded to a surface 11 of the wiring board 1 with its face down. More specifically, the thin semiconductor chip 2 is bonded to the board 1 and electrically connected to the wiring pattern formed on the board 1 via bumps 3 formed of an electrically conductive material such as gold so that an active surface 21 thereof including an active surface region formed with devices such as a transistor is opposed to the board surface 11.

A plurality of solder balls 4 are provided as terminals for external connection on a rear surface 12 of the wiring board 1 opposite from the surface 11 to which the semiconductor chip 2 is bonded.

A frame-like stiffener 5 of a synthetic resin material such as an epoxy resin is provided around the semiconductor chip 2. The stiffener 5 serves to strengthen the periphery of the thin wiring board 1 and to keep the planarity of the wiring board 1. A surface 51 of the stiffener 5 opposite from the wiring board 1 is generally flush with a non-active surface 22 of the semiconductor chip 2 opposite from the active surface 21.

As required, a heatsink plate 6 for dissipating heat from the semiconductor chip 2 is provided on the semiconductor chip 2 and the stiffener 5 as indicated by a phantom line in FIG. 1. If there was a height difference between the non-active surface 22 of the semiconductor chip 2 and the surface 51 of the stiffener 5 in this case, it would be difficult to attach the heatsink plate 6 in contact with both the non-active surface 22 of the semiconductor chip 2 and the surface 51 of the stiffener 5. In this embodiment, however, the non-active surface 22 of the semiconductor chip 2 is generally flush with the surface 51 of the stiffener 5, so that the heatsink plate 6 can easily be provided in contact with both the non-active surface 22 of the semiconductor chip 2 and the surface 51 of the stiffener 5.

Further, a production serial number and the like can be inscribed across the non-active surface 22 of the semiconductor chip 2 and the surface 51 of the stiffener 5, since the non-active surface 22 of the semiconductor chip 2 is generally flush with the surface 51 of the stiffener 5. Even if the semiconductor chip 2 has a small size as viewed in plan, a sufficient space can be provided for the inscription.

A space D is provided between the semiconductor chip 2 and the stiffener 5. Even if the semiconductor device is exposed to a high temperature, a difference in thermal expansion between the semiconductor chip 2 and the stiffener 5 can be accommodated by the space D. Therefore, the warp of the semiconductor device can be prevented which may otherwise occur due to the thermal expansion.

A low elasticity filler 7 such as of a synthetic resin material (e.g., a polyimide resin) having a lower elasticity than the stiffener 5 is filled in a space defined between the surface 11 of the wiring board 1 and the active surface 21 of the semiconductor chip 2. Thus, the active surface 21 of the semiconductor chip 2 can be protected, and stresses exerted on the bumps 3 can be alleviated. The empty space D provided between the semiconductor chip 2 and the stiffener 5 can also be provided between the stiffener 5 and the low elasticity filler 7, as shown in FIG. 1.

The non-active surface 22 of the semiconductor chip 2 and the surface 51 of the stiffener 5 are preferably mirror surfaces finished by a chemical polishing process. When the semiconductor device is mounted on a mounting board under monitoring with a camera, for example, the camera can recognize the semiconductor device with an improved accuracy because diffused light reflection on the non-active surface 22 of the semiconductor chip 2 and the surface 51 of the stiffener 5 is suppressed. Therefore, the semiconductor device can accurately be positioned at a desired mounting position on the mounting board. The mirror-finished non-active surface 22 and surface 51 each have an increased surface strength, so that the warp of the semiconductor device can more effectively be prevented which may otherwise occur due to the thermal expansion.

FIGS. 2(*a*) to 2(*d*) are sectional views illustrating a process sequence for fabrication of the semiconductor device shown in FIG. 1. FIG. 2(*a*) illustrates a chip bonding step. In the chip bonding step, a semiconductor chip 2 is face-down bonded to a surface 11 of a wiring board 1 formed with a wiring pattern with an active surface 21 thereof being opposed to the surface 11. At this time, the semiconductor chip 2 bonded to the wiring board 1 has a relatively great thickness, for example, on the order of 300 μm to 650 μm. Thereafter, a material for a low elasticity filler 7 is injected into a space defined between the surface 11 of the wiring board 1 and the active surface 21 of the semiconductor chip 2, whereby the space between the surface 11 and the active surface 21 is sealed with the low elasticity filler 7.

Figure 2A:
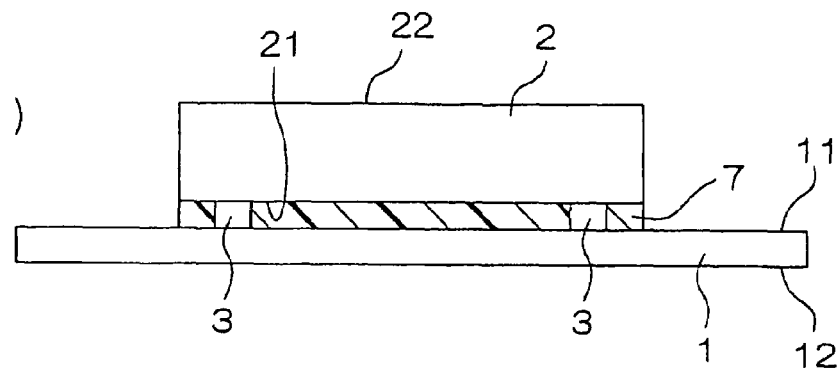
FIGS. 2(*a*) to 2(*d*) are sectional views illustrating a process sequence for fabrication of the semiconductor device shown in FIG. 1.
Figure 2B:
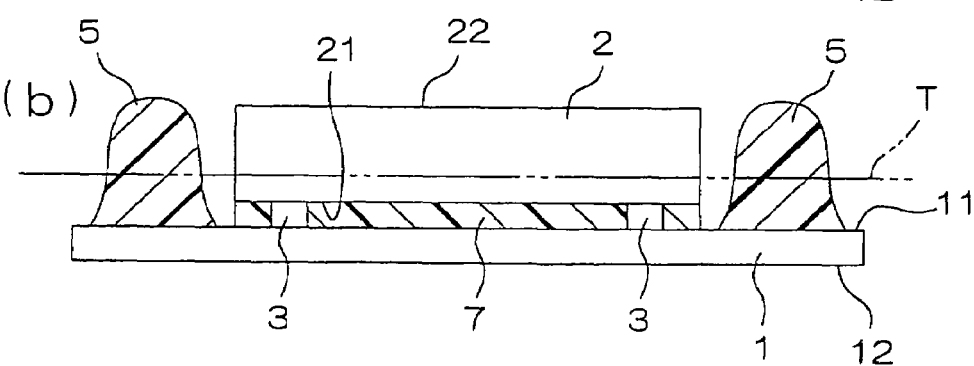

FIG. 2(b) illustrates a resin providing step to be performed after the chip bonding step. In the resin providing step, a liquid thermo-setting resin as a material for a stiffener 5 is applied on the surface 11 of the wiring board 1 mounted with the semiconductor chip 2 to surround the periphery of the semiconductor chip 2. Then, the resulting board is subjected to a heat treatment, whereby the thermo-setting resin provided around the semiconductor chip 2 is hardened for formation of the stiffener 5.

Figure 2C:
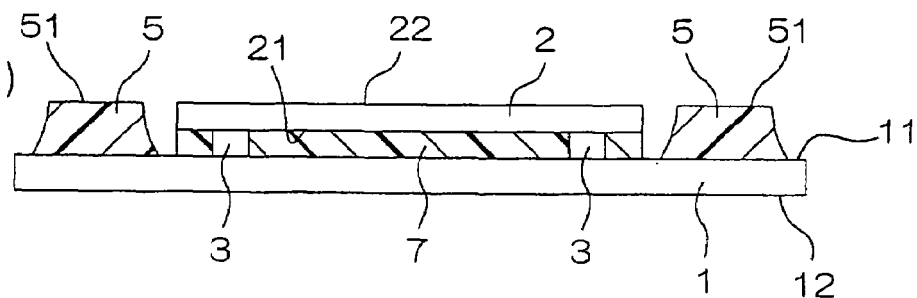
Figure 2D:
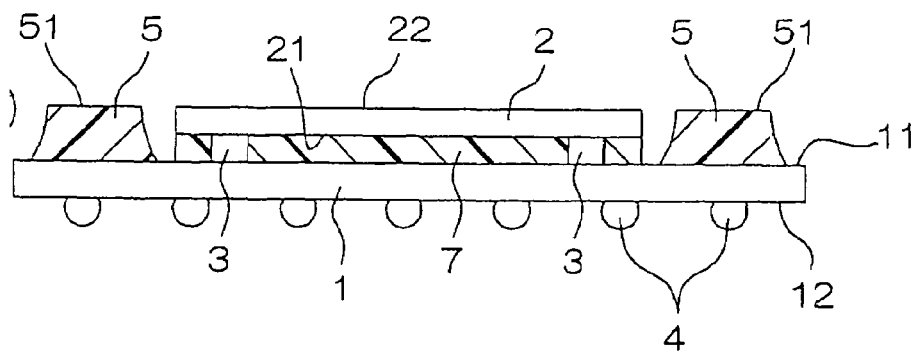

After the hardening of the thermo-setting resin, a planarization step (polishing step) is performed as shown in FIG. 2(c). In the planarization step, the semiconductor chip 2 and the stiffener 5 are simultaneously ground by means of a grinder. At this time, the simultaneous grinding of the semiconductor chip 2 and the stiffener 5 can alleviate a stress exerted on the semiconductor chip 2 during the grinding. Thus, the warp and chipping of the semiconductor chip 2 can be prevented. The simultaneous grinding of the semiconductor chip 2 and the stiffener 5 is carried out until the thickness of the semiconductor chip 2 and the stiffener 5 reaches a target thickness level T as indicated by a two-dot-and-dash line in FIG. 2(b). The target thickness level T is set, for example, so that the thickness of the semiconductor chip after the polishing is not greater than 200 μm.

Where a non-active surface 22 of the semiconductor chip 2 and a surface 51 of the stiffener 5 are to be mirror-finished, a chemical polishing process with the use of a chemical agent or a CMP (chemical mechanical polishing) process is performed after the planarization step. As required, a heatsink plate 6 (see FIG. 1) is attached onto the semiconductor chip 2 and the stiffener 5. Then, a plurality of solder balls 4 are provided on a rear surface 12 of the wiring board 1 as shown in FIG. 2(d). Thus, the semiconductor device having the aforesaid construction is fabricated.

The step of injecting the material for the low elasticity filler 7 into the space between the surface 11 of the wiring board 1 and the active surface 21 of the semiconductor chip 2 may be performed after the resin provision step or after the planarization step.

While the embodiment of the present invention has thus been described, the invention may be embodied in any other ways. The planarization for making the non-active surface 22 of the semiconductor chip 2 and the surface 51 of the stiffener 5 generally flush with each other is achieved by the grinding with the use of the grinder in the embodiment described above, but may be achieved by a chemical polishing process or a CMP process.

Further, the stiffener 5 is formed of the synthetic resin material in the embodiment described above, but may be formed of a metal material. In this case, a metal stiffener 5 is provided on the surface 11 of the wiring board 1, and then the semiconductor chip 2 and the metal stiffener 5 are simultaneously planarized.

Although the aforesaid embodiment is directed to the semiconductor device of the FCBGA structure having the ball-shaped terminals for external connection, the present invention may be applied to semiconductor devices of a flip chip bonding structure which have pin-shaped or land-shaped lead terminals.

Further, the invention may be applied not only to the semiconductor devices of the flip chip bonding structure but also to semiconductor devices of a chip-on-chip structure in which semiconductor chips are bonded to each other with active surfaces thereof being opposed to each other.

While the present invention has been described in detail by way of the embodiment thereof, it should be understood that the foregoing disclosure is merely illustrative of the technical principles of the present invention but not limitative of the same. The spirit and scope of the present invention are to be limited only by the appended claims.

This application corresponds to Japanese Patent Application No. 2000-322814 filed to the Japanese Patent Office on Oct. 23, 2000, the disclosure thereof being incorporated herein by reference.

What is claimed is:

1. A fabrication process for a semiconductor device, comprising the steps of:
   bonding a semiconductor chip to a surface of a solid device with an active surface of the semiconductor chip being opposed to the solid device;
   providing a synthetic resin material on the solid device surrounding the periphery of the semiconductor chip, the synthetic resin material forming a stiffener; and
   simultaneously grinding and/or polishing the surfaces of the semiconductor chip and the synthetic resin material, thereby planarizing the semiconductor chip bonded to the surface of the solid device and the synthetic resin material provided around the semiconductor chip after the resin providing step, so that a surface of the semiconductor chip opposite from the active surface becomes generally flush with a surface of the synthetic resin material opposite from the solid device;
   wherein the process includes providing an empty space such that the semiconductor chip is peripherally spaced away from the stiffener.

2. The process as set forth in claim 1, further comprising filling a low elasticity filler, having a lower elasticity than the stiffener, in between the surface of the solid device and a surface of the semiconductor chip opposed to the solid device.

3. The process as set forth in claim 2, wherein the step of filling a low elasticity filler comprises providing the empty space between the stiffener and the low elasticity filler as well as between the semiconductor chip and the stiffener.

4. The process as set forth in claim 1, further comprising a step of providing a heatsink plate for dissipating heat from the semiconductor chip on the surface of the semiconductor chip opposite from the solid device after the planarization step.

5. The process as set forth in claim 1, further comprising a step of providing an inscription across both of the surface of the semiconductor chip opposite from the solid device and the surface of the stiffener opposite from the solid device, after the planarization step.

6. The process as set forth in claim 1, wherein the planarization step comprises a step of mirror-finishing the surface of the semiconductor chip opposite from the solid device and the surface of the stiffener opposite from the solid device.

7. The process as set forth in claim 1, wherein the planarization step includes the step of simultaneously reducing thicknesses of the semiconductor chip and the synthetic resin material.

8. The process as set forth in claim 1, wherein resin is thermo-setting.

9. The process as set forth in claim 8, comprising applying the resin to the surface of the solid device as a liquid resin.

10. The process as set forth in claim 1, wherein the stiffener is epoxy resin.

* * * * *